United States Patent [19]

Blanks

[11] 4,060,643

[45] Nov. 29, 1977

[54] METHOD AND APPARATUS FOR IDENTIFYING COLOR SEPARATION FILM

[76] Inventor: William L. Blanks, 2343 N. Beckley Ave., Dallas, Tex. 75208

[21] Appl. No.: 714,101

[22] Filed: Aug. 13, 1976

Related U.S. Application Data

[62] Division of Ser. No. 654,513, Feb. 2, 1976, Pat. No. 4,003,745.

[51] Int. Cl.² ............................................. B32B 3/00
[52] U.S. Cl. ................................... 428/195; 96/27 R; 96/30; 96/41; 96/43; 428/207; 428/913
[58] Field of Search ............. 428/195, 206, 207, 532, 428/536, 913, 918; 96/27 R, 27 E, 30, 41, 42, 43

[56] References Cited

U.S. PATENT DOCUMENTS

| 3,326,682 | 6/1967 | Endermann et al. | 96/23 |
| 3,408,192 | 10/1968 | Aebi | 96/91 R X |
| 3,615,441 | 10/1971 | Deneau | 96/30 |
| 3,783,520 | 1/1974 | King | 96/383 X |
| 3,798,782 | 3/1974 | Lindahl | 96/41 X |
| 3,802,882 | 4/1974 | Kopylova | 96/30 |
| 3,902,901 | 9/1975 | Vogel | 96/30 |
| 3,913,477 | 10/1975 | Howland et al. | 96/30 X |

Primary Examiner—Thomas J. Herbert, Jr.
Assistant Examiner—Bruce H. Hess
Attorney, Agent, or Firm—Howard E. Moore; Gerald G. Crutsinger; Larry G. Dwight

[57] ABSTRACT

A color identifying tape having a clear or white background with a black positive register mark and a negative mark in fixed spaced relationship thereon. The black register mark forms colored background areas shaded in each primary color, red, yellow and blue in three quadrants about the register mark with a clear area to represent black, and the negative register mark has colored positive indicia on clear background corresponding to each color on the positive register mark. The color identifying tape is placed next to the article to be photographed and is photographed with black and white film through a series of filters to record the red color, the yellow color, the blue color, and the black color on separate frames of film such that the positive register marks become negative on the film and the negative register marks become positive. This allows alignment of the films in relationship with each other and the color background areas and positive indicia identifying the color represented by the film. The films are then affixed to sheets of material in corresponding fixed relationship to photoengrave lithographic printing plates.

7 Claims, 13 Drawing Figures

METHOD AND APPARATUS FOR IDENTIFYING COLOR SEPARATION FILM

This is a division, of application Ser. No., 654,513, filed Feb. 2, 1976, now U.S. Pat. No. 4,003,745.

BACKGROUND

Four color separation is a branch of color photography dealing with separating the three primary colors and black by filtration of the colors and recording the individual color on black and white film such that a photosensitive printing plate may be lithographed or photoengraved with the image of each color for producing printing plates to be used in four color printing.

An inverse or negative image of the color filtered is formed on the film of the copy after it is developed.

The next step of the process is to make a positive transparent film which may be tinted or screened to produce dots or half tones. Dots or half tones are necessary in order to photoengrave the plates since printing requires the positioning of dots onto the printed paper and not a solid mass of ink. The positive film allows more accurate evaluation of the tones.

Problems occur in identifying each film in each step of the process where each time the image is inversed or positive becomes negative, and negative becomes positive. Problems occur in aligning the film from step to step as only positive register marks give accurate alignment. Negative register marks are wider due to the physical spreading of light, and it is difficult to accurately register using the wider negative register marks. Accurate registration is necessary to give a true color reproduction.

In addition, viewing a piece of black and white film does not reveal with certainty the color that the film has recorded in it, therefore many mistakes may occur through careless handling of the film and mismarking of the film.

Previous methods of identifying the color recorded on the film involved rotation of a register mark having a black bar in a certain quandrant about the cross-hairs each time a photograph is taken of a new color. This requires physical handling of the register mark which would allow misalignment of the mark so that alignment of the film could not accurately be done in proceeding steps. In addition, rotation of the marks requires a great deal of time and may allow error in the identification of the film.

Other methods of identifying the film include human examination and scratching a mark on the film.

Color bars used for color balance in exposing the film are removed before engraving a plate and do not stay with the film to provide a permanent record.

SUMMARY OF THE INVENTION

I have devised a color identfying tape comprising a piece of material having a clear or white background divided into two sections with the first section having a black positive register mark and the second section having a negative or white register mark formed in a black outline. The black register mark divides the first section of the tape into four areas having three colored backgrounds representing each primary color and a clear area. The negative register mark divides the second section into four transparent or white areas which have positive colored indicia or a bar of each primary color disposed in three of the backgrounds corresponding to the colored backgrounds on the black positive register mark.

Placing the color identifying tape next to an article to be copied provides permanent register marks and color identification in fixed relationship on the film after it is exposed and developed. When the negative register mark is photographed and developed on film it becomes positive, whereas the black register mark when photographed becomes negative. The negative register mark which becomes positive on the film provides a method of accurately registering each film in relation to each other for alignment on a sheet of acetate which is aligned over a photosensitive printing plate for photoengraving the printing plate. In some processes the first film which is inversed is photographed again to produce a transparency (black image on transparent background) in which case the register marks are inversed once more, allowing accurate alignment of the transparencies with respect to each other.

The film is placed over a clear acetate sheet called a flat for accurate alignment with respect to each film containing such color, red, yellow, blue and black. These acetate sheets are then aligned on separate photosensitive printing plates wherein the light is exposed through the film and sheets to photoengrave the plate in a process well known to the art. This carries the color information and register marks necessary for printing onto the printing plates.

The primary object of the invention is to provide a device to identify and accurately align film at each stage of the four color separation process.

A further object of the invention is to provide a convenient and permanent method of recording the color onto the black and white negative film to eliminate human errors in determining the color.

A still further object of the invention is to provide a small device to record the color on black and white film when the article to be copied is small, such as a 35 millimeter transparency so that the idnetifying mark stays with the copied work.

A still further object of the invention is to provide a set of inverse marks of which one will be positive at all times during each step from negative to positive transparencies to allow accurate alignment of the film with respect to each other.

DESCRIPTION OF THE DRAWINGS

Drawings of a preferred embodiment of the invention are annexed so that the invention may be better and more fully understood, in which.

Numeral references are employed to designate parts throughout the drawing and like numerals designate like parts throughout the various figures of the drawings.

DESCRIPTION OF A PREFERRED EMBODIMENT

Figure 1:
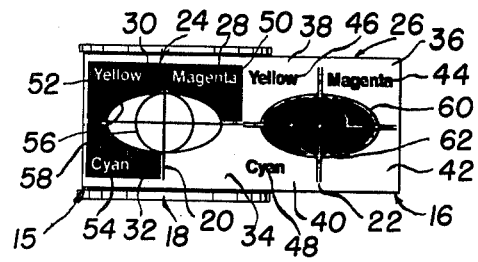
FIG. 1 is a front elevational view of the color identifying tape.

As illustrated in FIG. 1 the color identifying tape 15 comprises a sheet of material 16 having a clear or white background. The tape 15 may be torn from a reel 18 containing a roll of the sheet 16 as illustrated in the preferred embodiment. Tape 15 has an adhesive back to secure the material 16 to surfaces next to the work to be copied, or tape 15 may be affixed by using other common adhesives such as transparent tape or the like.

Color identifying tape 15 is comprised of a set of black positive register mark 20 and transparent negative register mark 22 in spaced fixed relation to each other and divide tape 15 into two sections 24 and 26. Register marks 20 and 22 may comprise cross hairs, a line, a dot, or other geometric figures locating a point. Section 24 is divided by positive register mark 20 into four areas 28, 30, 32, and 34. Area 28 has a colored background such as red or magenta. Area 30 has a colored background such as yellow. Area 32 has a colored background such as blue or cyan and area 34 is clear or white. Section 26 is divided into four areas 36, 38, 40 and 42 by negative register mark 22 each of said areas being clear or white. A color indicator such as a bar or indicia 44, 46, and 48 appear in areas 36, 38, and 40 corresponding to the color background areas 28, 30, and 32 of the positive register mark 20. The negative register marks 22 are surrounded by a black outline in order to distinguish the clear or white mark 22 such that it appears positive when photographed onto film.

Colored background areas 28, 30 and 32 may have clear or negative indicia 50, 52, and 54 respectively as illustrated in FIG. 1 indicating the color of the background.

Positive register mark 20 is connected by circular lines 56 and 58 and negative register mark 22 is connected by corresponding lines 60 and 62 to allow more accurate registration as will hereinafter be fully explained.

Figure 10:
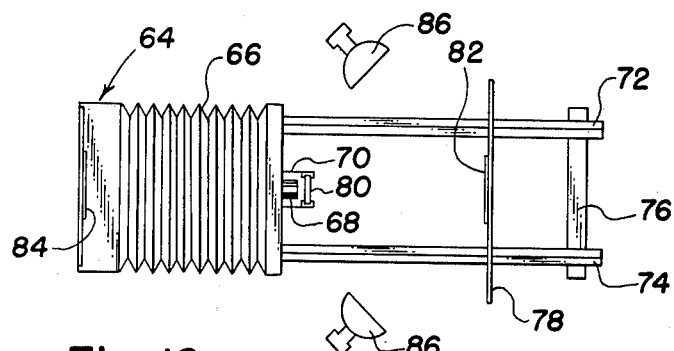
FIG. 10 is a plan view of a typical camera and copyboard.
Figure 11:
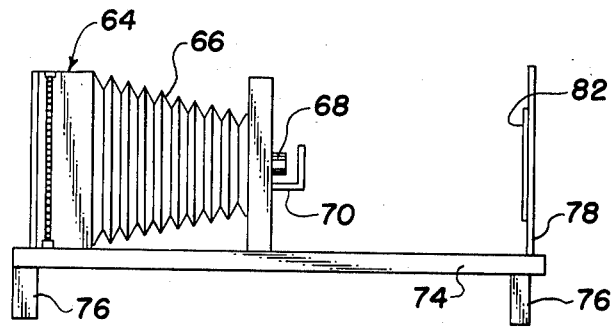
FIG. 11 is a side elevational view of FIG. 10.
Figure 13:
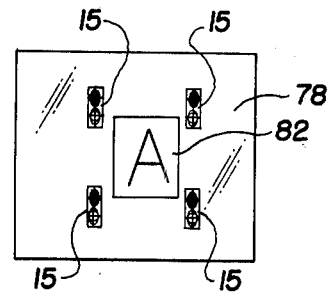
FIG. 13 is an elevational view of the copy and copyboard.

As illustrated in FIG. 10, a camera 64 having a bellows 66 and lens 68 with filter holder 70 mounted adjacent lens 68 is secured to rails 72 and 74 spaced by connector 76. Means to attach articles 82 to be copied comprise a copyboard 78 constructed of clear or white material slideably disposed on rails 72 and 74 parallel to lens 68 such that the distance between the lens 68 and the copyboard 78 can be adjusted. Appropriate subtractive filters 80 are inserted in the filter holder 70 in front of lens 68. Copy 82 is positioned on the copyboard 78 such that the lens 68 and copy 82 are parallel to each other. The copy 82 is any type of material containing an image to be reproduced such as a color illustration. The color identifying tape 15 is placed adjacent edges of the copy 82 on the copyboard 78 (FIG. 13), usually in at least 3 locations at the widest points of the copy 82. Copyboard 78 is then adjusted such that the copy 82 and tapes 15 placed adjacent thereto will be recorded by the film plate 84 at the rear section of camera 64. The bellows 66 is adjusted for proper focus and lights 86 are adjusted for proper illumination of copy 82.

A green filter is placed in filter holder 70 between lens 68 and copy 82 such that the red or magenta colors like those in areas 28 and 36 of tape 15 are darkened or subtracted and the other colors are highlighted by the filter. A photograph is taken of the copy 82 and the film developed.

Figure 2:
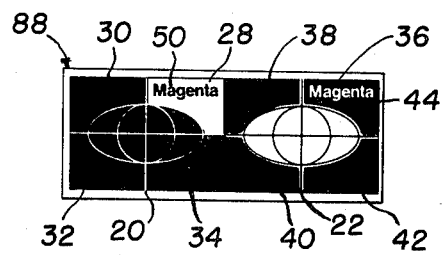
FIG. 2 is a front elevational view of a portion of the negative film recording the color red.
Figure 3:
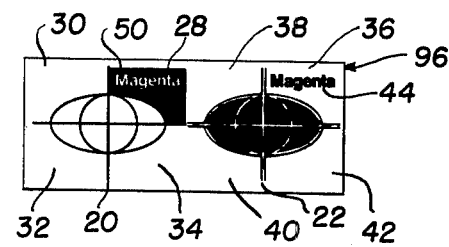
FIG. 3 is a front elevational view illustrating a portion of a transparency photograph taken from FIG. 2.

As illustrated in FIG. 2, film 88 shows a corner of the total film used to record the copy 82 and color identifying tape 15. The color identifying tape 15 appears in inverse relation such that red, area 28 is clear, and negative indicia 50 is positive. Positive register mark 20 appears white or negative, and negative register mark 22 appears black or positive while color bar 44 appears negative in area 36. All other areas appear black or positive. It should be readily apparent that black cannot be filtered and it appears with each color in the film.

Figure 4:
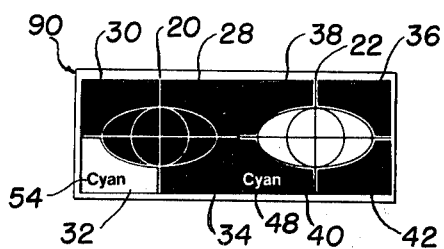
FIG. 4 is a front elevational view similar to FIG. 2 recording the color blue.
Figure 5:
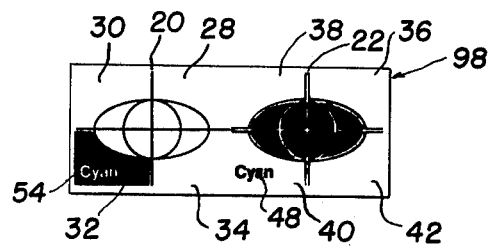
FIG. 5 is a front elevational view similar to FIG. 3.

A red filter is then placed in filter holder 70 and copy 82 is photographed. A portion of the resulting image is illustrated in FIG. 4 showing film 90 which records area 32 as being white or negative and indicia 54 as positive with color bar or indicia 48 appearing negative on a black background.

Figure 6:
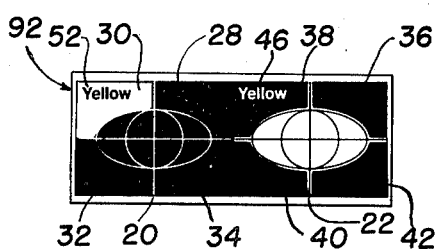
FIG. 6 is a front elevational view similar to FIG. 2 recording the color yellow.
Figure 7:
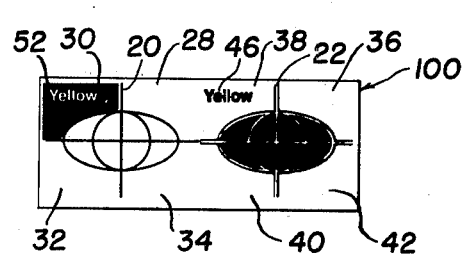
FIG. 7 is a front elevational view similar to FIG. 3.

A blue filter is then placed in filter holder 70 which substracts or absorbs yellow light such that developed film 92, a portion of which is illustrated in FIG. 6, shows the yellow background in area 34 as clear or negative and indicia 52 as positive with color bar 46 appearing negative on a dark background.

Figure 8:
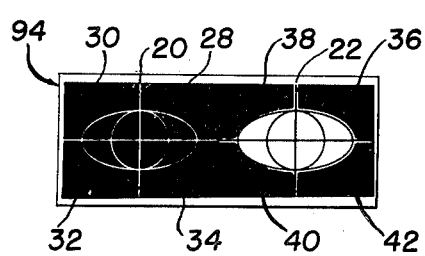
FIG. 8 is a front elevational view similar to FIG. 2 recording the color black.
Figure 9:
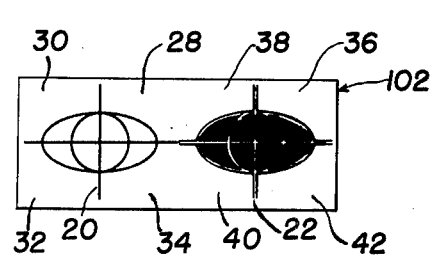
FIG. 9 is a front elevational view similar to FIG. 3.

As times a fourth color or black is required in which case a yellow-green or all three previously used filters are placed in filter holder 70 which allows only black to be recorded on the film 94 a portion of which is illustrated in FIG. 8.

It will be readily apparent that in each film the corresponding backgrounds 28-32 in section 24 appear negative except for the film 94 containing only black and corresponding color bars 44-48 in section 26 appear negative on the dark background corresponding to the color which is being recorded on the films 88-92, and that such backgrounds 28-32 or color bars 44-48 are in fixed relationship with the register marks 20 and 22. Positive register marks 20 becomes negative and the negative register marks 22 becomes positive in films 88-92 a section of which are illustrated in FIGS. 2, 4, 6 and 8.

The films 88-94 are comprised of an emulsion of a transparent acetate base and are usually a standard black and white film available from suppliers such as Eastman Kodak Company of Rochester, New York. Each of the developed films 88-94 must be aligned in stacked relationship to each other for accurate positioning on sheets of material called flats. Hence, the necessity of having positive register marks on films 88-94 for accurate alignment of the film. It will be noted that the positive register marks 20 on the copy appearing in FIG. 1 appears negative in FIGS. 2, 4, 6, and 8 and has a greater width such that no clear point of intersection appears on the register marks. Whereas the negative register marks 22 on the copy of FIG. 1 appears positive in FIGS. 2, 4, 6, and 8 and provides a single point for accurate alignment of the films 88-94 in relationship to each other. The film is rigidly secured to the flat by tape or other adhesive.

Some photoengraving processes such as "deep-etching" of a printing plate require positive transparencies such as illustrated in FIGS. 3, 5, 7, and 9 to more accurately etch the printing plate. In this case, the negative may be photographed or contact printed onto a similar black and white film such as films 96, 98, 100 and 102 portions of which are illustrated in FIGS. 2, 4, 6, and 8 such that the image areas from films 88-94 are inversed and the clear or white image areas in films 88-94 appear positive or black in the films 96-102 and dark areas will appear white or clear. One advantage of having a positive film 96-102 in FIGS. 3, 5, 7, and 9 is that grey tones may be more accurately controlled in the etching process.

The procedure of photoengraving may include placing a screen over films 88-94 such that dots will appear in the films 96, 98, 100 and 102. This is necessary in order to etch a printing plate which will properly print ink onto paper because color printing is made up of a multitude of small dots which appear solid when viewed with the naked eye. However, many techniques are used in the industry to screen the work at different stages.

Figure 12:
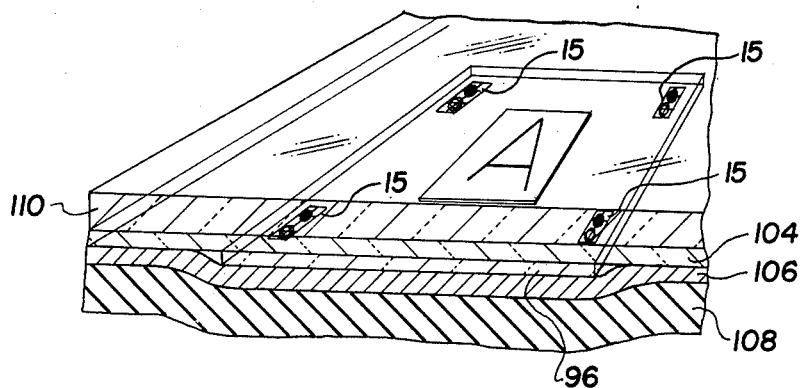
FIG. 12 is a cross-sectional perspective view of a flat with film on a printing plate being photoengraved.

As illustrated in FIG. 12 a typical transparency such as film 96 is mounted to a clear acetate sheet called a flat 104 wherein it is pressed against a photosensitive printing plate 106 which has a rubber backing 108 on a glass sheet 110. The glass sheet 110 is drawn tightly against the printing plate 106 by a vacuum, and a light source (not shown) is projected through the glass 110 and transparency 96 onto the photosensitive plate 106. The plate 106 is developed in a manner well known in the art such that the emulsion of the areas exposed to light are hardened and the area under the black areas on the transparency 96 are not exposed to light and the emulsion is washed away. The printing plate 106 is then treated with an acid solution well known in the art of photoengraving to etch the areas which were not exposed to light to make them ink-receptive. Areas exposed to light are then treated with a gum to make them water receptive, thus providing a lithographic printing plate.

It should be readily apparent that color identifying tapes 15 appear at the corners of film 96 such that the register marks are etched into plate 106. This allows registration of the plates 106 when they are attached to the plate cylinder of a printing press (not shown) such that the register marks 20 and 22 are used to align the plates 106 relative to each other at each station of the printing press for accurate color registration.

In order to accurately identify which color is engraved in plate 106, the color code adjacent the register marks 20 and 22 is carried with the film 96, 98, 100 and 102 to be engraved on the plate 106 such that the printer will know which color ink to use on the plate. This eliminates any chance of human error since the color was recorded in the original film 88, 90, 92 and 94 and transferred to films 96, 98, 100 and 102 in a manner which cannot be changed by human error. Therefore, the possibility of errors occuring in identifying the film on which particular colors are recorded is eliminated.

Operation and function of the hereinbefore described invention is as follows:

The color identifying tape 15 is placed next to the work 82 to be copied on the copyboard 78. Mathematical adjustments for film size and desired ratio of copy size to film size are computed and the copyboard and lens 68 are then set the correct distance apart. Bellows 66 is adjusted for a sharp focus on the copy 82. Copy 82 is then photographed once for each primary color, red, yellow, blue and black by placing a subtractive filter 80 in front of lens 68 in lens holder 70 of the appropriate color as hereinbefore discussed.

This produces four pieces of film which have recorded in them each of the four colors which are then developed. The film will appear in inverse or negative relationship to the article copied and depending upon the desired quality of the printing job the film may be photographed several times to produce positive transparencies or half tone films as known in the art. Often times, a screen is employed to produce dots over the image areas of the film.

The positive transparency film is placed on a sheet of transparent acetate usually called a flat. If negative film is used to photoengrave an opaque black flat is used and if positive transparencies are used as illustrated in FIG. 12 a clear transparent sheet is used. Each of the flats 104 is used to position the films in fixed relationship to the size of the printing plate being used. Each piece of film 96 from each color must be aligned with relationship to the other films 98, 100, and 102. This is accomplished by using the positive register marks 20 which occur at each stage of the photographing. As heretofore explained negative register mark 22 will become positive and the positive register marks 20 will become negative each time a film is rephotographed, allowing accurate registration of the film by positive register marks at any stage of the four-color separation process.

Several films having the same color recorded on them may be placed on a single flat 104 depending on the type of job. In doing so, color identification and register marks become more important so as not to mix the colors on one flat.

As illustrated in FIG. 12 the flat 104 and film 96 are placed under a transparent glass 110 next to a photosensitive printing plate 106 and a vacuum is drawn on the glass 110 to assure that no wrinkles occur and a strong light is passed through the film onto the printing plate 106.

As light strikes the photosensitive emulsion on the printing plate 106 it is hardened whereupon under the dark areas, such as the letter A in the box shown in FIG. 12, the emulsion is not exposed to light and will remain soft so that upon being developed is washed off exposing the metal surface of the plate. These areas are then exposed to an acid etching solution to make them ink receptive. The light exposed areas are treated with a gum solution to make them water receptive in a manner well known in the art.

Upon reading the foregoing it should be readily apparent that the embodiment heretofore described accomplishes the objects of the invention hereinbefore discussed.

It should be readily appreciated that other and further embodiments of the invention may be developed without departing from the basic concept thereof.

Having described my invention, I claim:

1. A color identifying tape for use in color separation photography comprising: a sheet of transparent material having first and second portions; an adhesive secured to one side of the transparent material; a black positive register mark on the first portion of the sheet; a negative register mark having a black outline in fixed spaced relation to the black positive register mark on the second portion of the sheet; colored backgrounds shaded in the three primary colors spaced in three quadrants about the black positive register mark, said backgrounds having negative indicia positioned therein to indicate the color of the background; and positive colored indicia shaded in primary colors and spaced in quadrants corresponding to the quadrants on the negative register mark corresponding to the quadrants on the colored backgrounds of the black positive register mark.

2. The article called for in claim 1 wherein the colored backgrounds are comprised of the colors magenta, yellow and cyan.

3. The article called for in claim 1 with the addition of negative indicia in each of the colored backgrounds to indicate the color of the background.

4. The article called for in claim 1 wherein the positive colored indicia on the negative register marks comprises a colored bar.

5. The article called for in claim 1 wherein the positive colored indicia spaced about the negative register mark comprises symbols to indicate the color.

6. The article called for in claim 1 wherein black positive register mark comprises cross-hairs and the negative register mark comprises cross-hairs.

7. The article called for in claim 6 with the addition of circular lines about the positive and negative register marks.

* * * * *